US011817455B2

(12) United States Patent
Appaswamy

(10) Patent No.: US 11,817,455 B2
(45) Date of Patent: Nov. 14, 2023

(54) LATERAL HIGH VOLTAGE SCR WITH INTEGRATED NEGATIVE STRIKE DIODE

(71) Applicant: Texas Instruments Incorporated, Dallas, TX (US)

(72) Inventor: Aravind Chennimalai Appaswamy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/348,525

(22) Filed: Jun. 15, 2021

(65) Prior Publication Data

US 2022/0223584 A1  Jul. 14, 2022

Related U.S. Application Data

(60) Provisional application No. 63/136,841, filed on Jan. 13, 2021.

(51) Int. Cl.
*H01L 29/08* (2006.01)
*H01L 27/082* (2006.01)
*H01L 21/8222* (2006.01)

(52) U.S. Cl.
CPC ........ *H01L 27/082* (2013.01); *H01L 21/8222* (2013.01); *H01L 29/0808* (2013.01); *H01L 29/0821* (2013.01)

(58) Field of Classification Search
CPC ............. H01L 21/8222; H01L 27/0262; H01L 27/082; H01L 29/0808; H01L 29/0821; H01L 29/87
See application file for complete search history.

(56) References Cited

U.S. PATENT DOCUMENTS

| | | | | | |
|---|---|---|---|---|---|
| 4,786,958 | A | * | 11/1988 | Bhagat | ................ H01L 29/7455 257/143 |
| 5,204,541 | A | * | 4/1993 | Smayling | ............ H01L 27/0623 257/140 |
| 6,960,792 | B1 | * | 11/2005 | Nguyen | .................. H01L 29/87 257/E29.026 |
| 7,196,889 | B2 | * | 3/2007 | Gerrish | ............... H01L 27/0255 361/91.1 |
| 2008/0203534 | A1 | * | 8/2008 | Xu | ...................... H01L 27/0259 257/E21.608 |
| 2018/0323183 | A1 | * | 11/2018 | Chen | ................... H01L 27/0259 |

* cited by examiner

*Primary Examiner* — Meiya Li
(74) *Attorney, Agent, or Firm* — Yudong Kim; Frank D. Cimino

(57) ABSTRACT

An SCR with a first semiconductor region and plural concentric semiconductor regions, each surrounding the first semiconductor region. The SCR also includes, surrounded by at least one concentric semiconductor region in the plurality of concentric semiconductor regions, an electrically non-contacted region of a semiconductor type and positioned to modulate a snapback voltage of the silicon controlled rectifier and an electrically-contacted region of the semiconductor type and positioned to provide a diodic response between the at least one concentric semiconductor region in the plurality of concentric semiconductor regions and the electrically-contacted region.

22 Claims, 10 Drawing Sheets

LATERAL HIGH VOLTAGE SCR WITH INTEGRATED NEGATIVE STRIKE DIODE

CROSS-REFERENCE TO RELATED APPLICATION

This application claims the benefit of and priority to U.S. Provisional Application No. 63/136,841, filed Jan. 13, 2021, which is hereby fully incorporated herein by reference.

BACKGROUND

The example embodiments relate to a silicon controlled rectifier (SCR), as may be used in electrostatic discharge (ESD) protection.

ESD is the sudden flow of electricity between two objects as electrical charge transfers from one of the objects to the other. For integrated circuit (IC) durability and longevity, ESD protection is sometimes included and applied to an IC circuit or IC node(s). Such protections are more common and necessary as ICs are downscaled, dopant concentrations are increased, and ICs are implemented in locations where nearby structures provide potential ESD pulse sources. ESD protection redirects current away from the IC in the event of an ESD pulse (strike), preventing damage that otherwise could occur were the strike received by an IC signal path. When an ESD strike is not occurring, ideally the ESD protection circuit does not affect IC operation.

One approach to ESD protection is an SCR with an anode connected to an electrical pad that is to be ESD protected. The SCR requires various attributes in such an ESD application. For example, the SCR is off under nominal conditions at the pad, but the SCR needs a robust snapback response to a positive ESD strike at the pad (and also at the SCR anode). The snapback is to occur when the pad voltage reaches a positive trigger level, typically much higher than the pad nominal voltage. When the trigger voltage is reached or exceeded, the desired SCR response is for the SCR to conduct, the voltage across it to drop quickly (snaps back) to a much lower holding voltage, and at the same time current through the SCR is to significantly increase, to shunt that ESD pulse current. Certain SCR devices also include a negative strike diode to provide a diodic response to a negative ESD strike at the pad. Accordingly, when the pad voltage reaches a negative trigger level, the desired response is for the SCR to conduct the current with a response resembling that of a diode, with a negative current shunted from the SCR anode to its cathode.

While the above concepts have been implemented with varying degrees of success, certain drawbacks may occur. For example, area efficiency is often a key design consideration. However, certain area-reducing geometries may compromise performance. To the contrary, alternative approaches to avoid such performance compromise may propose a separate negative strike diode. Such an approach, however, is not ideal as it requires large (and possibly parallel) diodes, increasing concerns of leakage, capacitance, and area.

This document provides example embodiments that may improve on certain of the above concepts, as detailed below.

SUMMARY

In one example embodiment, there is an SCR, comprising a first semiconductor region and a plurality of concentric semiconductor regions, wherein each concentric semiconductor region in the plurality of concentric semiconductor regions surrounds the first semiconductor region. The SCR also includes, surrounded by at least one concentric semiconductor region in the plurality of concentric semiconductor regions, an electrically non-contacted region of a semiconductor type and positioned to modulate a snapback voltage of the silicon controlled rectifier and an electrically-contacted region of the semiconductor type and positioned to provide a diodic response between the at least one concentric semiconductor region in the plurality of concentric semiconductor regions and the electrically-contacted region.

Other aspects and embodiments are also disclosed and claimed.

DETAILED DESCRIPTION

Figure 1:
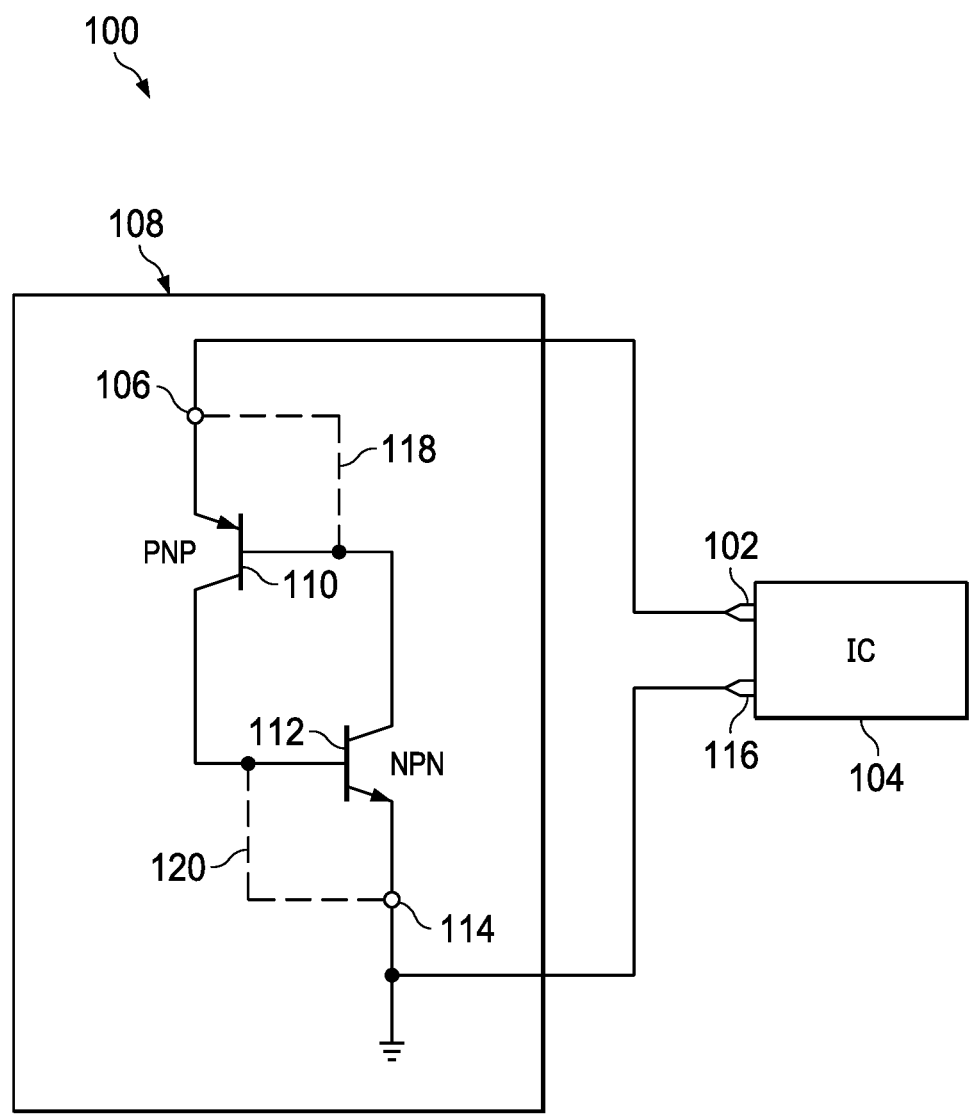
FIG. 1 illustrates an electrical diagram of an ESD protection system, including an SCR.

FIG. 1 illustrates an electrical diagram of an ESD protection system 100. The ESD protection system 100 includes a first node 102 that is ESD protected. As an example, the first node 102 is connected to an IC 104, where the first node 102 may by example be an input and/or output ("input/output") pad of the IC 104. As another example, the first node 102 may represent an internal conductive point of the IC 104, or an external conductive point of the IC 104, including a pin. The IC 104 may be any type of circuit, for which it is expected that the first node 102 may experience ESD events, such as in a relatively high voltage device or environment. As further detailed later, the ESD protection system 100 endeavors to shunt energy to protect the IC 104 during an ESD strike, where the ESD strike may, in terms of polarity, be either a positive or negative strike at the first node 102.

The first node 102 is also connected to an anode 106 of an SCR 108, where the SCR 108 provides ESD protection to the first node 102 (and, by extension, to the IC 104). FIG. 1 illustrates the SCR 108 electrically, where later discussion and illustrations detail an example embodiment in which the SCR 108 is implemented as a lateral semiconductor device. Electrically, the SCR 108 includes a PNP bipolar junction transistor (BJT) 110 and an NPN BJT 112. As shown later, structurally the PNP and NPN BJTs 110 and 112 may share some common p-type and n-type regions, which the shared regions embody portions of the FIG. 1 electrical connectivity. Also regarding that connectivity, in addition to the anode 106, the SCR 108 includes a cathode 114 (which may or may not connect to the device substrate), which is connected to a second node 116 of the IC 104, where the second node 116 may be connected to a low potential, such as ground. The anode 106 is provided by the PNP BJT 110 emitter, and the cathode 114 is provided by the NPN BJT 112 emitter. The collector of the PNP BJT 110 is connected to the base of the NPN BJT 112, and the collector of the NPN BJT 112 is connected to the base of the PNP BJT 110. The preceding connections are generally accomplished through the structural relationship of semiconductor regions, while an additional level of contact, such as through metal, can include two additional contact connections shown in FIG. 1 by dashed lines and that provide interconnects between semiconductor regions. Specifically, a first contact connection 118 is an electrical contact that provides the anode 106 and couples to both the PNP BJT 110 emitter and the NPN BJT 112 collector (and to the PNP BJT 110 base). And, a second contact connection 120 is an electrical contact that provides the cathode 114 and couples to both the NPN BJT 112 emitter and the PNP BJT 110 collector (and to the NPN BJT 112 base). Lastly, while not explicitly labeled in FIG. 1, the NPN BJT 112 base-to-PNP BJT 110 collector connection is also sometimes referred to as a gate of the SCR 108, where the gate in some implementations is floating and in others can be connected to a voltage bias.

Figure 2:
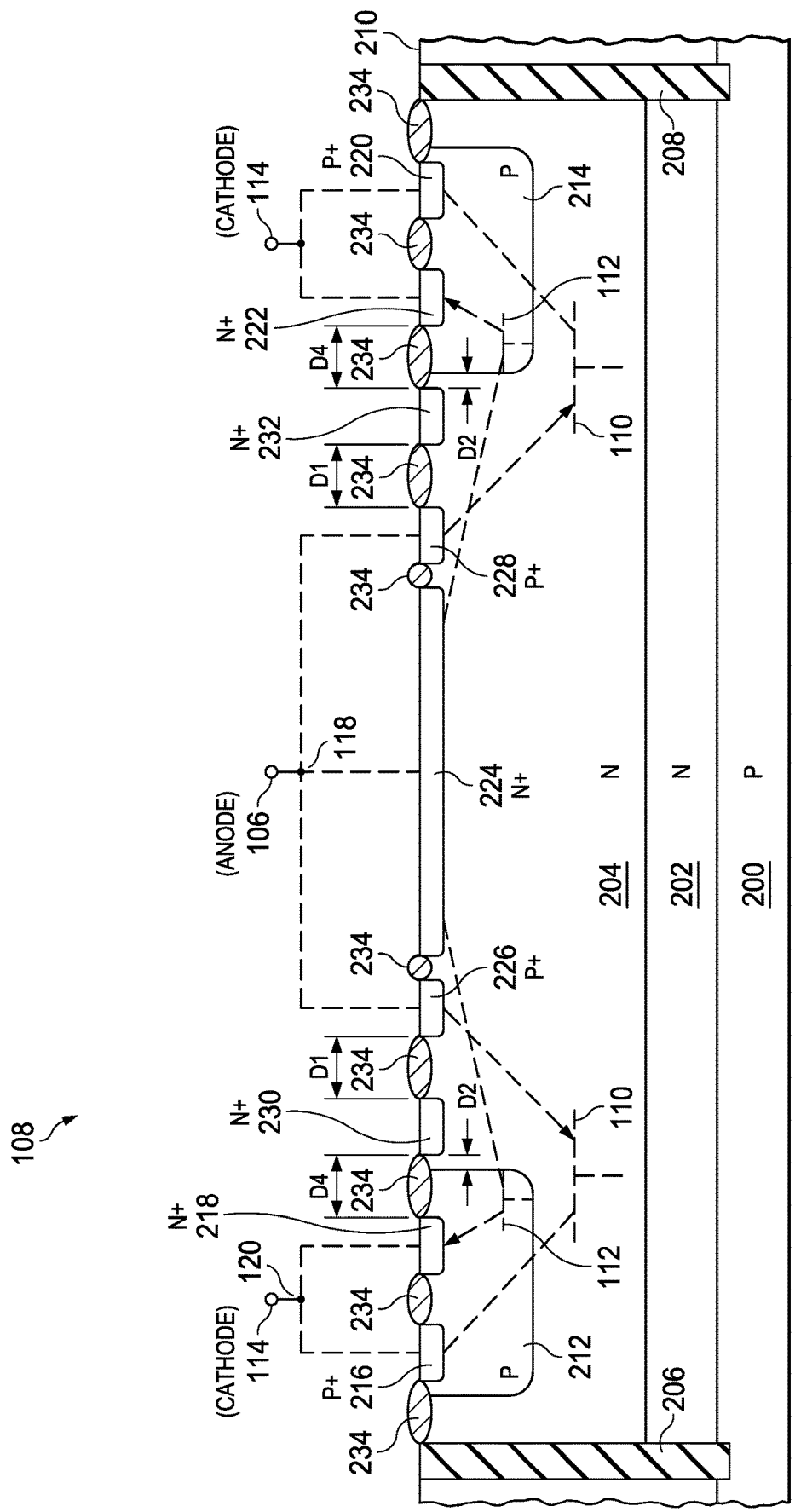
FIG. 2 illustrates a cross-sectional view of the FIG. 1 SCR, across a line 2-2 shown in FIG. 3.
Figure 3:
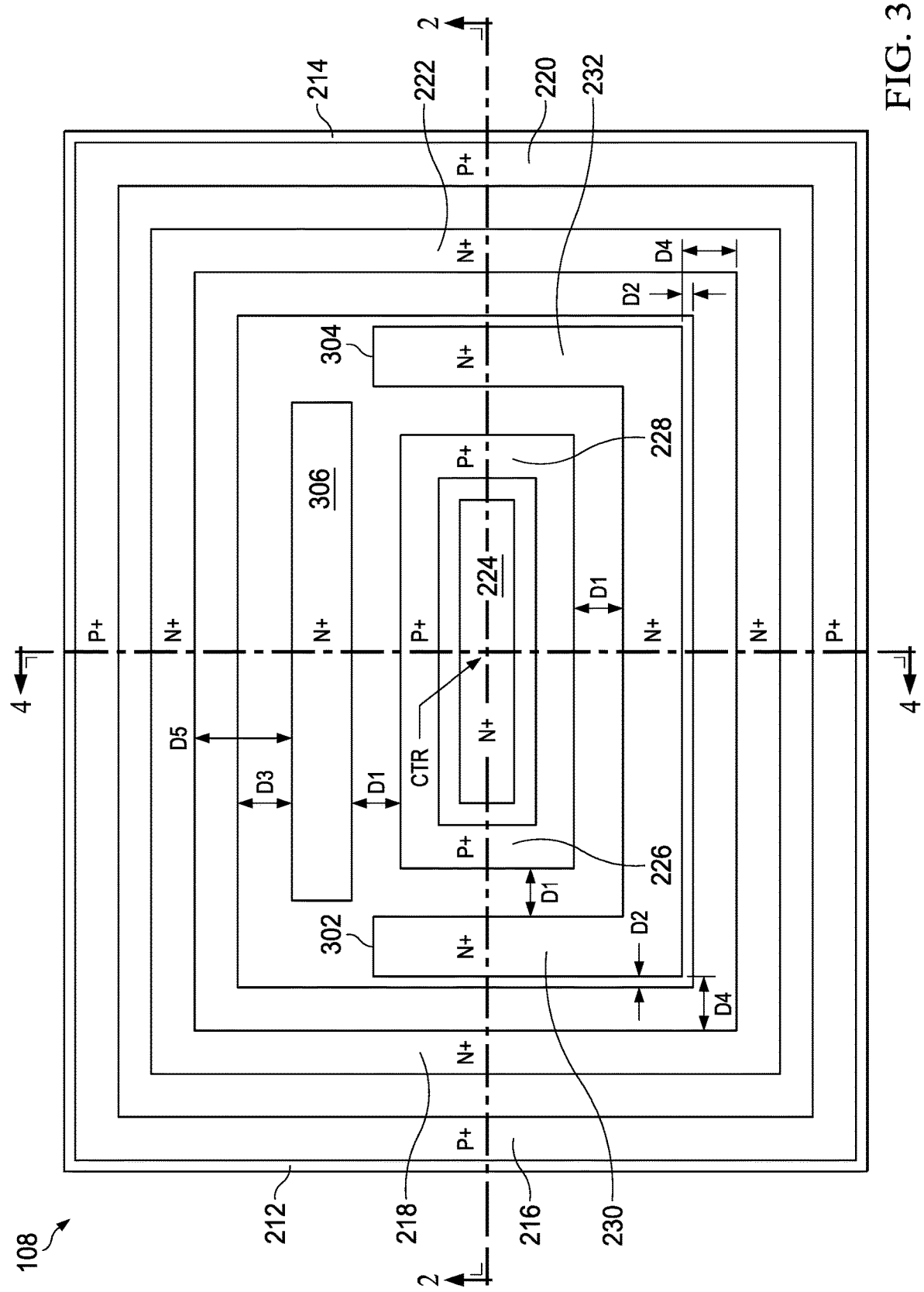
FIG. 3 illustrates a plan view of the FIG. 1 SCR.

FIG. 2 illustrates a first cross-sectional view of the FIG. 1 SCR 108 in a semiconductor implementation, and along the line 2-2 in the plan view of FIG. 3, where FIG. 3 is further explained later. Portions of the SCR 108 are formed generally in layers relative to a p type layer 200, such as a p type substrate (e.g., a p type substrate and a small layer of lightly doped p type epitaxial (epi) layer atop it). N type portions are formed in the p type layer 200, for example as shown by an n type buried layer 202, above which is an n type epi layer 204. The n type buried layer 202 may be formed by implanting and diffusing (e.g., by heat) relatively heavily concentrated n type dopants. The n type epi layer 204 may be formed by growing the n type epi layer 204 with appropriate (e.g., relatively lightly concentrated) n type dopants. Toward the outside edges of the illustrated layout, trench regions 206 and 208 are formed, for example by first forming a trench through the various layers down to the p type layer 200, second forming sidewall oxides (not separately shown) along each trench region 206 and 208, third filling the remaining void, between the sidewall oxides, with doped polysilicon to provide a deep electrical contact down to the p type layer 200, and fourth providing a highly doped p+ contact on top of the doped polysilicon, so that electrical contact, such as in a metal layer, can be made to the highly doped p+ contact, Accordingly, the highly doped p+ contact provides an electrical conductive path through the doped polysilicon and to the p type layer 200.

Additional portions of the SCR 108 are formed relative to the above-described layers and an upper edge 210 of the n epi layer 204. A first p well 212 and a second p well 214 are formed within the n type epi layer 204, for example by implanting and diffusing relatively lightly concentrated p type dopants. Within the first p well 212, a first p+ region 216 and a first n+ region 218 are formed, for example by ion implantation. Similarly, within the second p well 214, a second p+ region 220 and a second n+ region 222 are formed, for example by ion implantation. Centrally shown in FIG. 2 and adjacent the upper edge 210, a third n+ region 224 is formed. Outwardly from the third n+ region 224, a third p+ region 226 and a fourth p+ region 228 are formed within the n type epi layer 204, or in an alternative embodiment a respective p well may be formed first in those areas with each of the third p+ region 226 and the fourth p+ region 228 then formed in a respective one of those p wells, akin to each of the first p+ region 216 and second p+ region 220 being formed in a respective p well 212 and 214. Outwardly from third p+ region 226, a fourth n+ region 230 is formed, and similarly and outwardly from the fourth p+ region 228, a fifth n+ region 232 is formed. Lastly, various isolation regions 234 (e.g., silicon dioxide) are shown along the upper edge 210, as may be formed by various processes, including local isolation of silicon (LOCOS).

FIG. 2 also includes the FIG. 1 anode 106 and the cathode 114, as well as the related first and second contact connections 118 and 120, now further described. As introduction, certain combinations of regions and areas in FIG. 2 provide the structural equivalent to the FIG. 1 schematic of the PNP BJT 110 and the NPN BJT 112; to assist the reader, the schematic of each of those two BJTs is superimposed in FIG. 2, respectively, in large dashed lines. Accordingly, and for the approximate left half of FIG. 2, the PNP BJT 110 is provided by: (i) the third p+ region 226 as its emitter; (ii) a path through the n type epi layer 204 as its base; and (iii) the combination of a path through the first p well 212 and the first p+ region 216 as its collector. Also in that approximate left half of FIG. 2, the NPN BJT 112 is provided by: (i) the first n+ region 218 as its emitter; (ii) a path through the first p well 212 as its base; and (iii) the combination of a path through the n epi layer 204 and the third n+ region 224 as its collector. For reference, the following Table 1 summarizes each BJT base, collector, or emitter, and its corresponding structural counterpart(s) in the approximate left half of FIG. 2:

TABLE 1

| BJT component | Structural counterpart(s) |
| --- | --- |
| PNP BJT 110 emitter | third p + region 226 |
| PNP BJT 110 base | n type epi layer 204 |
| PNP BJT 110 collector | first p well 212 and first p + region 216 |
| NPN BJT 112 emitter | first n + region 218 |
| NPN BJT 112 base | first p well 212 |
| NPN BJT 112 collector | n epi layer 204 and third n + region 224 |

Given the preceding, each of the first and second contact connections 118 and 120 may be formed in a contact (e.g., metal) layer. Accordingly, the anode 106 is connected by the first contact connection 118 to the PNP BJT 110 emitter (the third p+ region 226) and to the NPN BJT 112 collector (the third n+ region 224, which is electrically conductive to the n epi layer 204). And, the cathode 114 is connected by the second contact connection 120 to the PNP BJT 110 collector (the first p+ region 216, which is electrically conductive to the first p well 212) and the NPN BJT 112 emitter (the first n+ region 218).

The FIG. 2 cross-sectional view illustration is symmetric (or at least approximately symmetric) about an imaginary vertical line down its middle, due to a ring like top view architecture of the SCR 108 as further discussed later. Accordingly, the preceding discussion relating to the approximate left half of FIG. 2 introduces like observations with respect to the right half of FIG. 2, that is, the structure to the right also may represent the FIG. 1 PNP BJT 110 and the NPN BJT 112. The following Table 2 thus summarizes each BJT base, collector, or emitter, and its corresponding structural counterpart(s) in the approximate right half of FIG. 2:

TABLE 2

| BJT component | Structural counterpart(s) |
|---|---|
| PNP BJT 110 emitter | fourth p+ region 228 |
| PNP BJT 110 base | n type epi layer 204 |
| PNP BJT 110 collector | second p well 214 and second p+ region 220 |
| NPN BJT 112 emitter | second n+ region 222 |
| NPN BJT 112 base | second p well 214 |
| NPN BJT 112 collector | n epi layer 204 and third n+ region 224 |

From the preceding, and from the FIG. 2 illustration of alone, one skilled in the art may anticipate, as a first approximation, symmetric operation about the vertical center of the SCR 108, in terms of charge application and resultant circuit behavior. However, at least two other SCR 108 aspects are now introduced, with further details demonstrated in FIGS. 3 and 4. First, the SCR 108 includes the fourth n+ region 230 and the fifth n+ region 232, which in FIG. 2 are electrically non-contacted in the physical sense that there is no structural metal layer applying a potential to those regions—however, for reasons detailed later, note that each of the fourth n+ region 230 and the fifth n+ region 232 is coupled, resistively through the n epi layer 204, to the anode potential applied to the third n+ region 224, which may further impact the SCR 108 operation. Second, the SCR 108 is symmetric in the FIG. 2 dimension, but is asymmetric in another dimension, which also impacts the SCR 108 operation and, as shown below, does so favorably in producing respectively different SCR responses, relative to either a positive or negative polarity ESD strike.

FIG. 3 illustrates a plan view of the SCR 108, which is simplified by either not illustrating or labeling certain regions (e.g., the FIG. 2 isolation regions 234 and the trench regions 206 and 208). The plan view illustrates that the SCR 108 is generally concentric in that several of its features, but not all, fully surround a common center CTR. For example, the FIG. 3 left outermost boundary illustrates the outermost border of the first p well 212, and symmetrically about the CTR, the FIG. 3 right outermost boundary illustrates the outermost border of the second p well 214. Further, the FIG. 3 plan view reveals that these two p wells 212 and 214 are actually a same p type semiconductor region that forms a first p type continuous region that surrounds the CTR within the SCR 108; for reference sake, where such a continuous region exists, it also may be referred to herein by including both numbers from FIG. 2, separated by a forward slash (e.g., first p type continuous well region 212/214). As another example, to the interior of the first p type continuous well region 212/214, the FIG. 3 left side illustrates the first p+ region 216, and symmetrically about the CTR, the FIG. 3 right side illustrates the second p+ region 220. Here again, these two p+ regions 216 and 220 are actually within a same and first p+ type continuous region 216/220 that surrounds the CTR within the SCR 108. Accordingly, portions along the first p+ type continuous region 216/220 may provide the FIG. 2 PNP BJT 110 collector. Closer to the CTR than the first p+ type continuous 216/220 region is a first n+ type continuous region 218/222, surrounding the CTR and including the first n+ region 218 and the second n+ region 222. Accordingly, portions along the first n+ type continuous 218/222 region may provide the FIG. 2 NPN BJT 110 emitter. As still another example, and closest to the CTR, a second p+ type continuous region 226/228 concentrically surrounds the CTR, and it includes the FIG. 2 third p+ region 226 and the FIG. 2 fourth p+ region 228. Given the various concentric regions, the SCR 108 may be considered a ring link architecture.

FIG. 3 also illustrates a first interior n+ region 230/232, which is surrounded by some of the other continuous regions (e.g., the first p type continuous well region 212/214; the first p+ type continuous 216/220 region; the first n+ type continuous region 218/222) and includes the FIG. 2 fourth n+ region 230 and the fifth n+ region 232, which recall are electrically non-contacted. The first interior n+ region 230/232, however, is not continuous around the entirety of the CTR, but instead, forms a U-shape in the FIG. 3 plan perspective, having terminal ends 302 and 304. Beyond the terminal ends 302 and 304 and, also surrounded by the same continuous regions that surround the first interior n+ region 230/232, the SCR 108 also includes a second interior n+ region 306. In an example embodiment, the second interior n+ region 306 is formed from a same dopant type and concentration as the first interior n+ region 230/232. Also in an example embodiment, the second interior n+ region 306 is generally rectangular from a plan perspective. Still further in an example embodiment, the second interior n+ region 306 is spaced a same minimum distance, D1, from the second p+ type continuous region 226/228, as is first interior n+ region 230/232. Note that distance D1, as with other distances described herein, is stated to be a minimum distance, to describe a measure of the closest distance between the identified structures. Accordingly, the distance D1 is measured between respective points where the first interior n+ region 230/232 is closest to the second p+ type continuous region 226/228, and similarly where the second interior n+ region 306 is closest to the second p+ type continuous region 226/228. Also with respect to the first interior n+ region 230/232, if the first interior n+ region 230/232 were continuous to surround the entirety of the second p+ type continuous region 226/228, then the geometry could include that of the second interior n+ region 306. Instead, however, the discontinuity created by the terminal ends 302 and 304 cause an electrical isolation between the first interior n+ region 230/232 and the second interior n+ region 306, so that each may be electrically configured in a different manner, as further detailed below.

Figure 4:
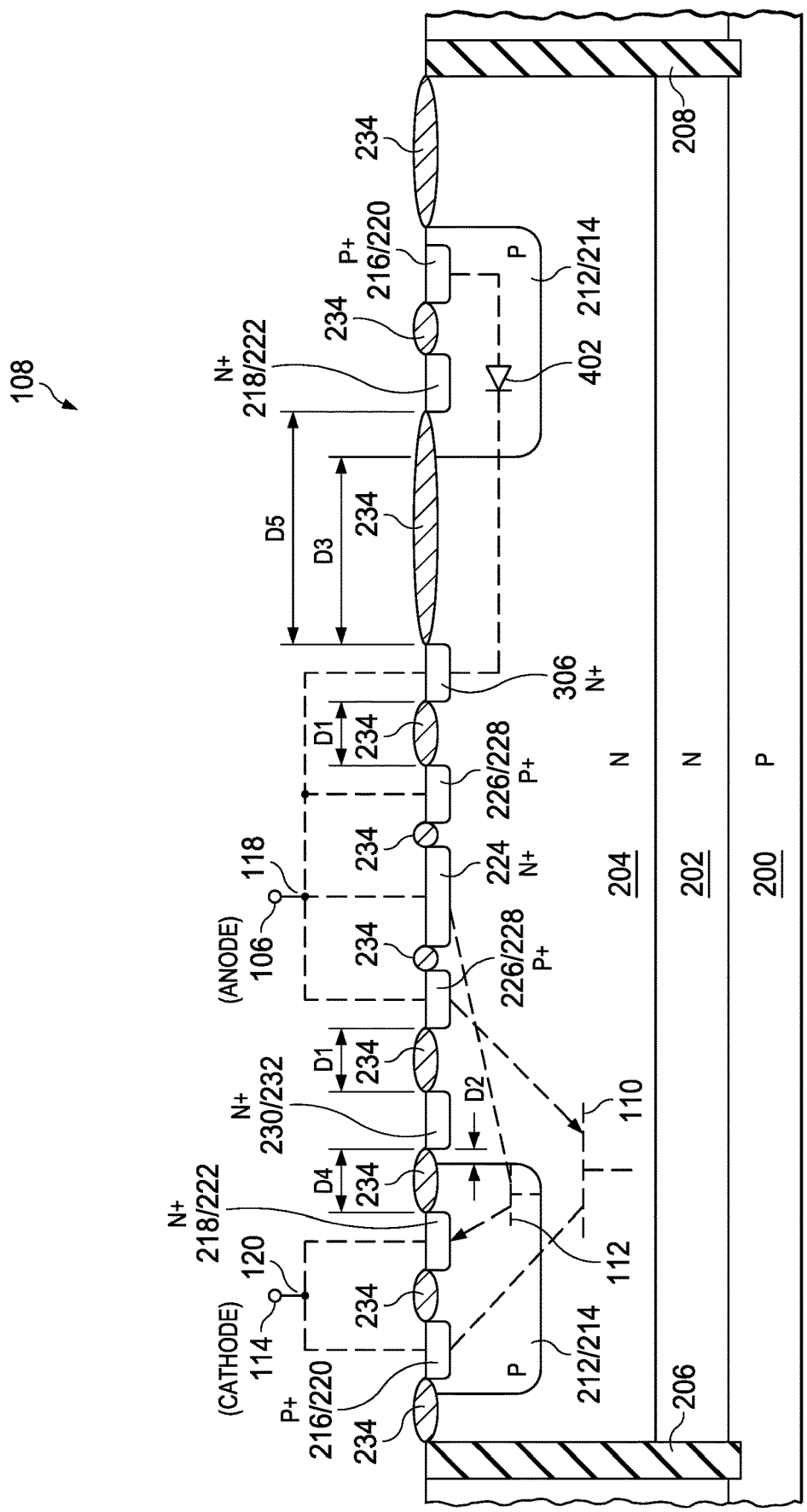
FIG. 4 illustrates a cross-sectional view of the FIG. 1 SCR, across a line 4-4 shown in FIG. 3.

FIG. 4 illustrates a cross-sectional view of the FIG. 1 SCR 108 along the line 4-4 in the plan view of FIG. 3, which is orthogonal with respect to the FIG. 2 view. Items illustrated to the left in FIG. 4 appear generally the same as in FIG. 2, although the FIG. 3 reference numbers are also used in FIG. 4, where FIG. 3 introduced that some FIG. 2 regions are from continuous regions introduced in FIG. 3. The FIG. 4 view traverses some of those continuous regions, so the continuous region reference is shown in FIG. 4. For example, to the left in FIG. 4 and regarding the PNP BJT 110, its collector is formed by the first p+ type continuous region 216/220 and the first p type continuous well region 212/214, and its emitter is formed by the second p+ type continuous region 226/228. As another example to the left in FIG. 4 and regarding the NPN BJT 112, its emitter is formed by the first n+ type continuous region 218/222, and its base is formed by the first p type continuous well region 212/214.

FIG. 4 illustrates additional aspects of the independent first interior n+ region 230/232 and the second interior n+ region 306, introduced above in connection with FIG. 3. Recall in plan view those two regions generally align in a concentric geometry relative to other surrounding regions, but they are physically isolated from one another. FIG. 4 further illustrates that electrically the two regions are also distinctive. Particularly, as noted above from the FIG. 2 discussion, the fourth n+ region 230 and the fifth n+ region 232 are electrically non-contacted, and as shown in FIG. 3, those regions are in the same first interior n+ region 230/232.

In FIG. 4, however, the anode 106 is connected as it was in FIG. 2, but in addition it is further connected to the second interior n+ region 306. In FIG. 4, therefore, to the left side of the centrally-located third n+ region 224, there is a first interior n+ region 230/232 that is electrically non-contacted (hereafter, the electrically non-contacted first interior n+ region 230/232), while to the right side of the centrally-located third n+ region 224, there is a second interior n+ region 306 that is electrically-contacted (hereafter, the electrically-contacted second interior n+ region 306). Accordingly, if a signal is applied to the anode 106, including a possible ESD strike, that signal is coupled as described earlier to the PNP BJT 110 emitter (via the second p+ type continuous region 226/228) and to the NPN BJT 112 collector (via the third n+ region 224), and as shown in FIG. 4, it is also coupled to the electrically-contacted second interior n+ region 306. Thus, while portions of the electrically non-contacted first interior n+ region 230/232 and the electrically-contacted second interior n+ region 306 are symmetrically positioned relative to the centrally-located third n+ region 224, the two electrically differ, one electrically non-contacted and one the electrically-contacted by the anode 106. The operational effects from this difference are described later.

FIG. 4 also illustrates a geometric asymmetry relative to the electrically non-contacted first interior n+ region 230/232 and the electrically-contacted second interior n+region 306. First, in a symmetric manner, a same distance D1 is shown outwardly and to the right and left relative to the centrally-located third n+ region 224; in the left, D1 is between the outer boundary of the second p+ type continuous region 226/228 and the inner boundary of the electrically non-contacted first interior n+ region 230/232, and to the right D1 is between the outer boundary of the second p+ type continuous region 226/228 and the inner boundary of the electrically-contacted second interior n+ region 306. Accordingly, each of the inner boundary of the electrically non-contacted first interior n+ region 230/232 and the inner boundary of the electrically-contacted second interior n+ region 306 is generally symmetrically spaced about the FIG. 3 CTR. Second, in an asymmetric manner, the next spatial relationship shown outwardly from the inner boundary of the electrically non-contacted first interior n+ region 230/232 and the inner boundary of the electrically-contacted second interior n+ region 306 is not a same dimension. Specifically, to the left and outward from the electrically non-contacted first interior n+ region 230/232, a minimum distance D2 occurs to the adjacent positioned first p type continuous well region 212/214; in contrast, to the right and outward from the electrically-contacted second interior n+ region 306, a minimum distance D3, which is larger than D2 (e.g., by a factor of two to three), occurs to the adjacent positioned first p type continuous well region 212/214. Accordingly, the electrically non-contacted first interior n+ region 230/232 is a closer distance (D2) to its adjacent first p type continuous well region 212/214 than is the distance (D3) between the electrically-contacted second interior n+ region 306 and its adjacent first p type continuous well region 212/214. As described below, these differing distances facilitate favorable SCR 108 operational attributes. Also in this regard, recall that within the first p type continuous well region 212/214 there is a more inwardly located first n+ type continuous region 218/222. Accordingly, a similar spatial difference arises on the FIG. 4 left and right side with respect to the illustrated portions of that first n+ type continuous region 218/222. Particularly, the electrically non-contacted first interior n+ region 230/232 is a closer minimum distance D4 to its adjacent portion of the first n+ type continuous region 218/222 than is a minimum distance D5 between the electrically-contacted second interior n+ region 306 and its adjacent first n+ type continuous region 218/222. Indeed, these relative spatial differences, combined with a possible potential from the anode 106 to the electrically-contacted second interior n+ region 306, create different electrical conductive paths to the left and right of FIG. 4. In this regard and for illustrative purposes, a schematic of a diode 402 is superimposed to the right in FIG. 4, with its anode provided by the combination of the illustrated portion of the first p+ type continuous region 216/220 and the adjacent first p type continuous well region 212/214, and with its cathode provided by a portion of the n type epi layer 204 and the electrically-contacted second interior n+ region 306. The diode 402 operation is discussed later.

The electrical operation of the SCR 108, as depicted in FIGS. 2 through 4, is now described. From the prior discussion and the FIG. 3 plan view, in general the SCR operates in a first manner in the FIG. 3 horizontal direction (across the FIG. 2 cross-section) and in a second manner in the FIG. 3 vertical direction (across the FIG. 4 cross-section). The different operations are influenced, in this example embodiment, by differing geometries in those two, generally orthogonal, directions. Particularly, a first set of continuous and concentric regions provide a first aspect of these operations, while a second set of regions, including the physically and electrically differing electrically non-contacted first interior n+ region 230/232 and electrically-contacted second interior n+ region 306, provide a second and differing aspect of these operations.

Figure 5:
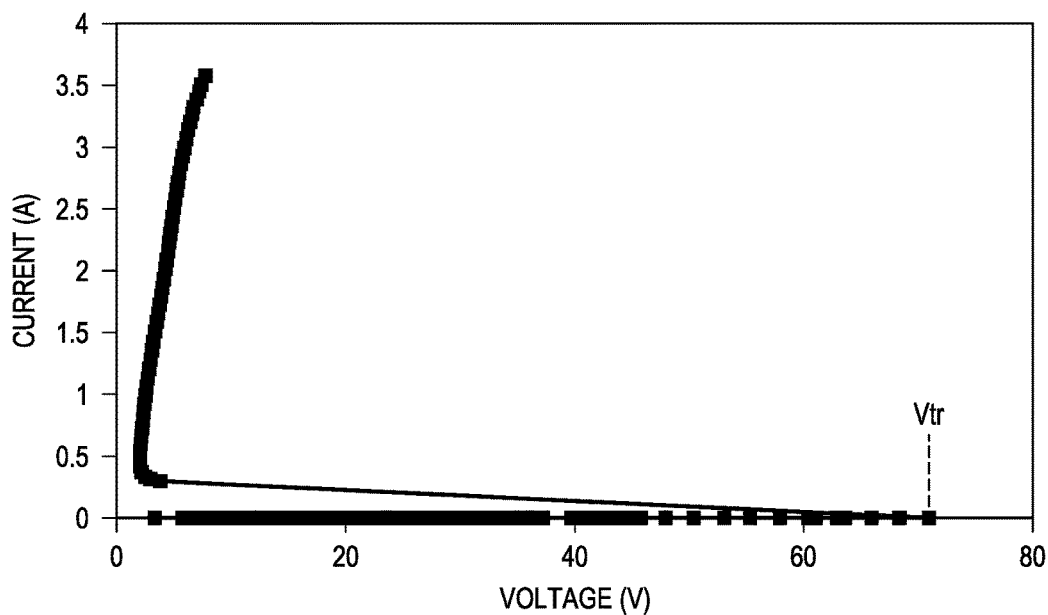
FIG. 5 illustrates an SCR positive ESD strike response curve.

FIG. 5 illustrates a response curve 500 to a positive ESD strike on the SCR 108 anode 106. The response curve 500 illustrates voltage along its horizontal axis and current along its vertical axis. Prior to the positive ESD strike, the SCR 108 remains in a non-conductive state and presents a very high resistance, both of which are favorable attributes in an ESD protective system, such as in the FIG. 1 ESD protection system 100. When the positive ESD strike occurs, voltage quickly rises at the anode 106, and a trigger voltage Vtr is reached, which in the illustrated example is approximately 70V. In response, the SCR 108 resistance quickly drops, the SCR 108 begins to conduct far greater current, and the anode voltage quickly decreases, sometimes referred to as snapback, to a voltage less than 10V.

The FIG. 5 response curve 500 also can be understood in connection with the FIG. 2 cross-sectional view. With the connected relationship of the PNP BJT 110 and the NPN BJT 112, a turning on of one BJT turns on the other. In the FIG. 5 example of a positive ESD strike, the positive charges couples through the third n+ region 224 and increases the potential of the n type epi layer 204. The increased n type epi layer 204 potential will reach the avalanche breakdown level of the junction between that n type epi layer 204 and, to the left in FIG. 2, the first p well 212 and, to the right in FIG. 2, to the second p well 214. The breakdown level is the SCR 108 trigger voltage, and that trigger voltage also can be reduced, as is sometimes favorably desired, by either the electrically non-contacted fourth n+ region 230 to the left in FIG. 2 or the electrically non-contacted fifth n+ region 232 to the right in FIG. 2, as each reduces the resistance in a portion of the charge path between the n epi layer 204 and either the first p well 212 or the second p well 214, respectively, thereby modulating (adjusting, in this case reducing) the breakdown voltage. At breakdown, current flows through the junction, thereby providing base current to, and turning on, the NPN BJT 112. Once the NPN BJT 112 is on to conduct sufficient current, that current turns on the PNP BJT 110. With both BJT 110 and 112 conducting, a large current can pass through the SCR 108 as FIG. 5 shows with the rise to approximately 3.7A, which in FIG. 1 thereby shunts the positive ESD strike charge to the IC 102 second node 116. As the charge dissipates, the current flow reduces to a level insufficient to keep the BJTs 110 and 112 on, at which point the SCR 108 returns to an off state.

Figure 6:
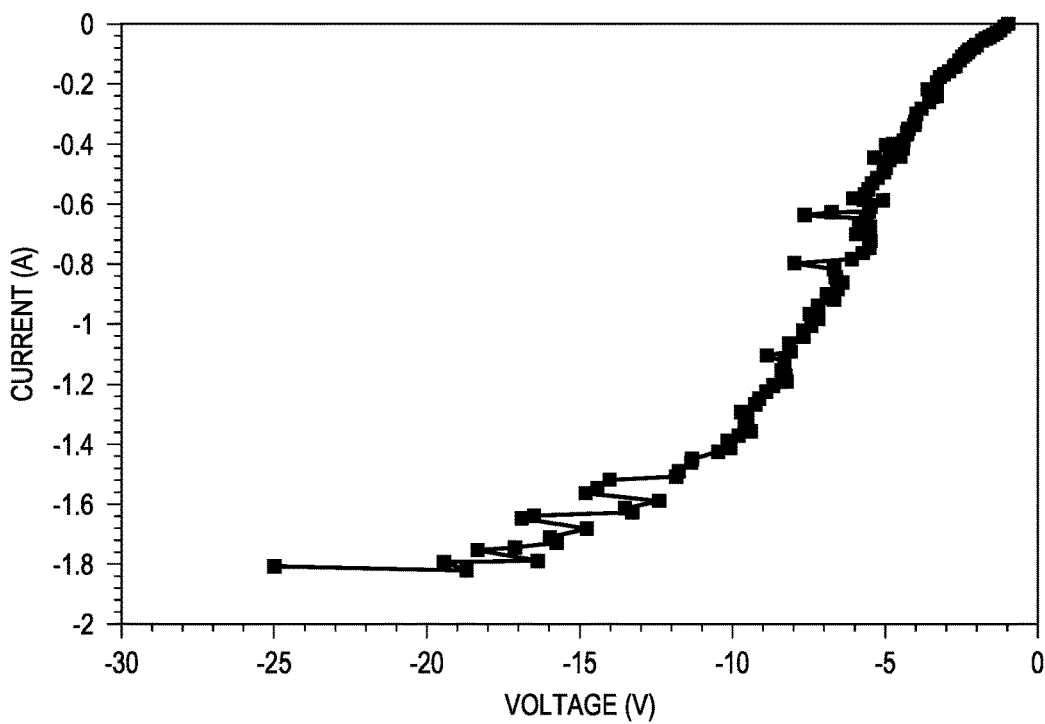
FIG. 6 illustrates an SCR negative ESD strike response curve.

FIG. 6 illustrates a response curve 600 to a negative ESD strike on the SCR 108 anode 106. The response curve 600 illustrates voltage along its horizontal axis and current along its vertical axis. Prior to the negative ESD strike, again the SCR 108 remains in a non-conductive state and presents a very high resistance. When the negative ESD strike occurs, note that were the FIG. 2 cross-section to be representative of all cross-sections across the SCR 108, then it would be possible that the SCR 108 would operate again in a snapback manner, with opposite polarity of that shown in FIG. 5. Such a response to a negative surge, however, is not desirable, as the high trigger voltage can result in damage to a protected circuit (e.g., the FIG. 1 IC 104). Indeed, note that in the positive direction (FIG. 5), the internal junctions of the IC 104 may tolerate some initial rise in the anode signal as those junctions also are likely to have a relatively high breakdown voltage, whereas in the negative direction, those internal junctions are likely to be diodic, thereby less robust to a high negative spike and, as a result, requiring a diodic protective response by the SCR 108. Accordingly, and for reasons detailed below, for a negative strike the SCR 108 provides the response curve 600. In the response curve 600, as voltage magnitude increases in the negative direction, current magnitude also increases in the negative direction, and at least a portion of the response curve 600 is approximately linear. Such a response is akin to the operation of a diode, and such diodic response is favorable in the FIG. 1 ESD protection system 100 as the current resulting from the ESD negative strike begins to shunt with near linearity to the rise in magnitude of voltage.

The FIG. 6 response curve 600 also can be understood in connection with the FIG. 4 cross-sectional view. To the left of FIG. 4, the structure is the same as it is in FIG. 2, with the possible conduction of both the PNP BJT 110 and NPN BJT 112. As noted above, however, the operation of only those BJTs in response to a negative strike could create an undesirable snapback type response, including accumulating too large a voltage at the anode 106 (and the FIG. 1 first node 102) before discharging current. However, to the right of FIG. 4, recall the illustration of the diode 402. Particularly, because the anode 106 is connected to the electrically-contacted second interior n+ region 306, when a negative ESD strike occurs at the anode 106, the negative charge coupled to the electrically-contacted second interior n+ region 306 creates a lower resistance conductive path through the regions represented by the diode 402, those being, from right to left in FIG. 4: (i) the first p+ type continuous region 216/220; (ii) the first p type continuous well region 212/214; (iii) the n type epi layer 204; and (iv) the electrically contacted second interior n+ region 306. Accordingly, in one aspect, the diode 402 facilitates the FIG. 6 response curve 600. In addition, the increased spatial relationship to the right of FIG. 4, as shown by D3 and D5, relative to the shorter corresponding distances to the left of FIG. 4, as shown by D2 and D4, further facilitates the response curve 600. Particularly, because the anode 106 applies a bias to the electrically-contacted second interior n+ region 306 during the negative ESD strike, if FIG. 4 were equally dimensioned on its right as it is on its left, then the bias could create a parasitic NPN transistor, including the right side first n+ type continuous region 218/222, the right side first p type continuous well region 212/214, and the electrically-contacted second interior n+ region 306; so, in contrast to the left side NPN BJT 112 which has its collector at the (centrally located) third n+ region 224, a right side parasitic NPN could occur with a collector at the electrically-contacted second interior n+ region 306, creating undesirable operation. With the relative increased dimension of D3 or D5, however, the possibility of a right side parasitic NPN transistor is reduced, while the possibility of the desired operation of the diode 402 is increased. Indeed, these factors thereby combine to produce a favorable snapback response curve 500 in FIG. 5 and a favorable diode response curve 600 in FIG. 6.

Certain of the above concepts may be summarized by returning to FIG. 3. Generally, the vertically-illustrated "legs" of the U-shaped configuration of the electrically non-contacted first interior n+ region 230/232 provides the FIG. 2 cross-section, when taken across those legs, as they are symmetrically spaced relative to the other continuous regions of the first p+ type continuous 216/220 region, the first n+ type continuous region 218/222, the second p+ type continuous region 226/228, and about the third n+ region 224 is formed. In those locations, the SCR 108 operation provides the FIG. 5 response curve 500, in response to a positive ESD strike, and with the trigger voltage modulated by the electrical state of the electrically non-contacted first interior n+ region 230/232. Also generally, FIG. 3 in the vertical direction provides the FIG. 4 cross-section, when taken from one side of the CTR across the n+ region between the vertically-illustrated legs of the U-shaped configuration of the first interior n+ region 230/232, and to the other side through the electrically-contacted second interior n+ region 306. In those locations, the SCR 108 operation provides the FIG. 6 response curve 600, in response to a negative ESD strike. Accordingly, the combination of orientations across the partially concentric SCR 108 structure, and/or the selective anode connection to the electrically-contacted second interior n+ region 306 in combination with the electrically non-contacted first interior n+ region 230/232, provides a favorable response to both positive and negative ESD strikes.

Figure 7:
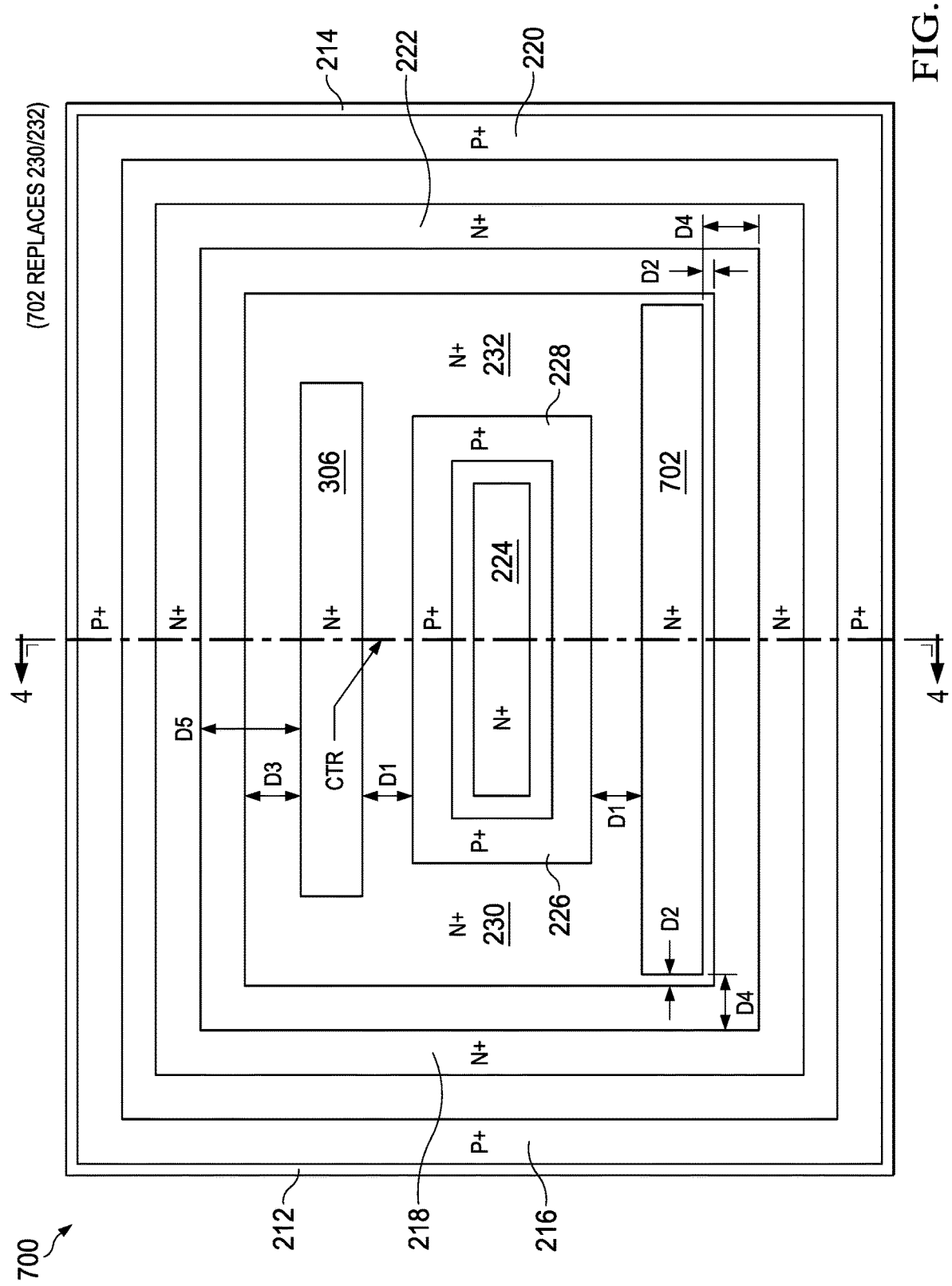
FIG. 7 illustrates a first alternative SCR.

FIG. 7 illustrates a first alternative SCR 700, in a plan view that includes many of the same aspects as the FIG. 3 SCR 108, and like numbers are used for like items in both figures. As to a difference, however, in the FIG. 7 SCR 700, instead of the U-shaped electrically non-contacted first interior n+ region 230/232, the SCR includes an electrically non-contacted third interior n+ region 702 that is shaped generally the same as (but not necessarily equally dimensioned), and parallel to, the electrically-contacted second interior n+ region 306, and the electrically non-contacted third interior n+ region 702 is on the opposite side of the third n+ region 224, as compared to the electrically-contacted second interior n+ region 306. In the SCR 700, the electrically non-contacted third interior n+ region 702 can be influenced by anode potential through a resistive path, while again the electrically-contacted second interior n+ region 306 is physically connected to the SCR anode 106. Accordingly, a vertical cross section across the approximate center of FIG. 7 provides the same structure as shown in FIG. 4, albeit with the electrically non-contacted third interior n+ region 702 replacing the FIG. 4 illustration of the electrically non-contacted first interior n+region 230/232 (and for reference, the line 4-4 is again shown in FIG. 7). Returning then to FIG. 4, but in the context of the FIG. 7 SCR 700, the structure generally to the left of FIG. 4 supports the FIG. 5 snapback response curve 500, while the structure generally to the right of FIG. 4 supports the FIG. 6 diodic response curve 600. Additionally, the FIG. 7 SCR 700 may reduce field and current crowding that can occur at corners, inasmuch as both of the electrically-contacted second interior n+ region 306 and the electrically non-contacted third interior n+ region 702 are rectangular and parallel with respect to one another.

Figure 8:
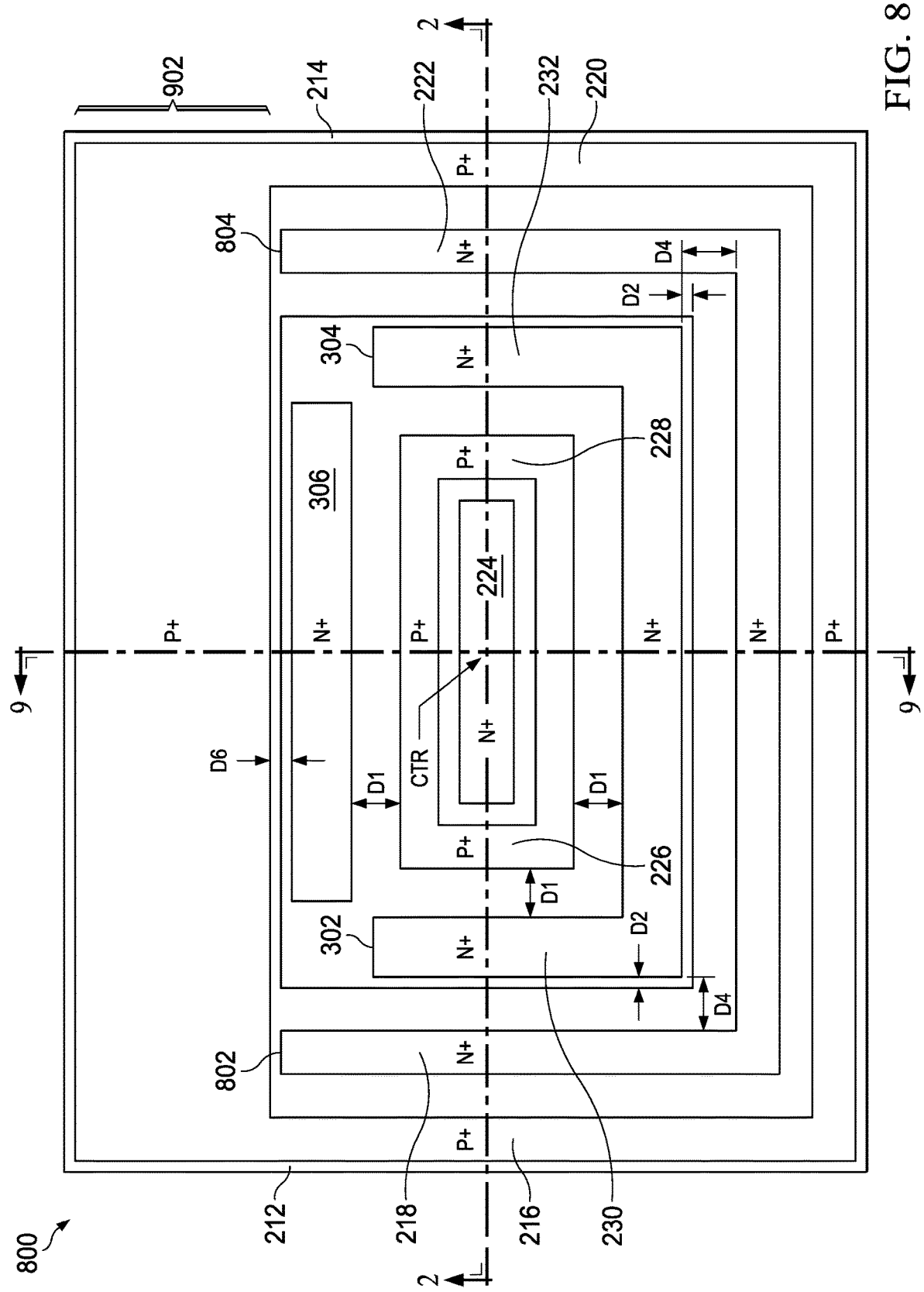
FIG. 8 illustrates a plan view of a second alternative SCR.
Figure 9:
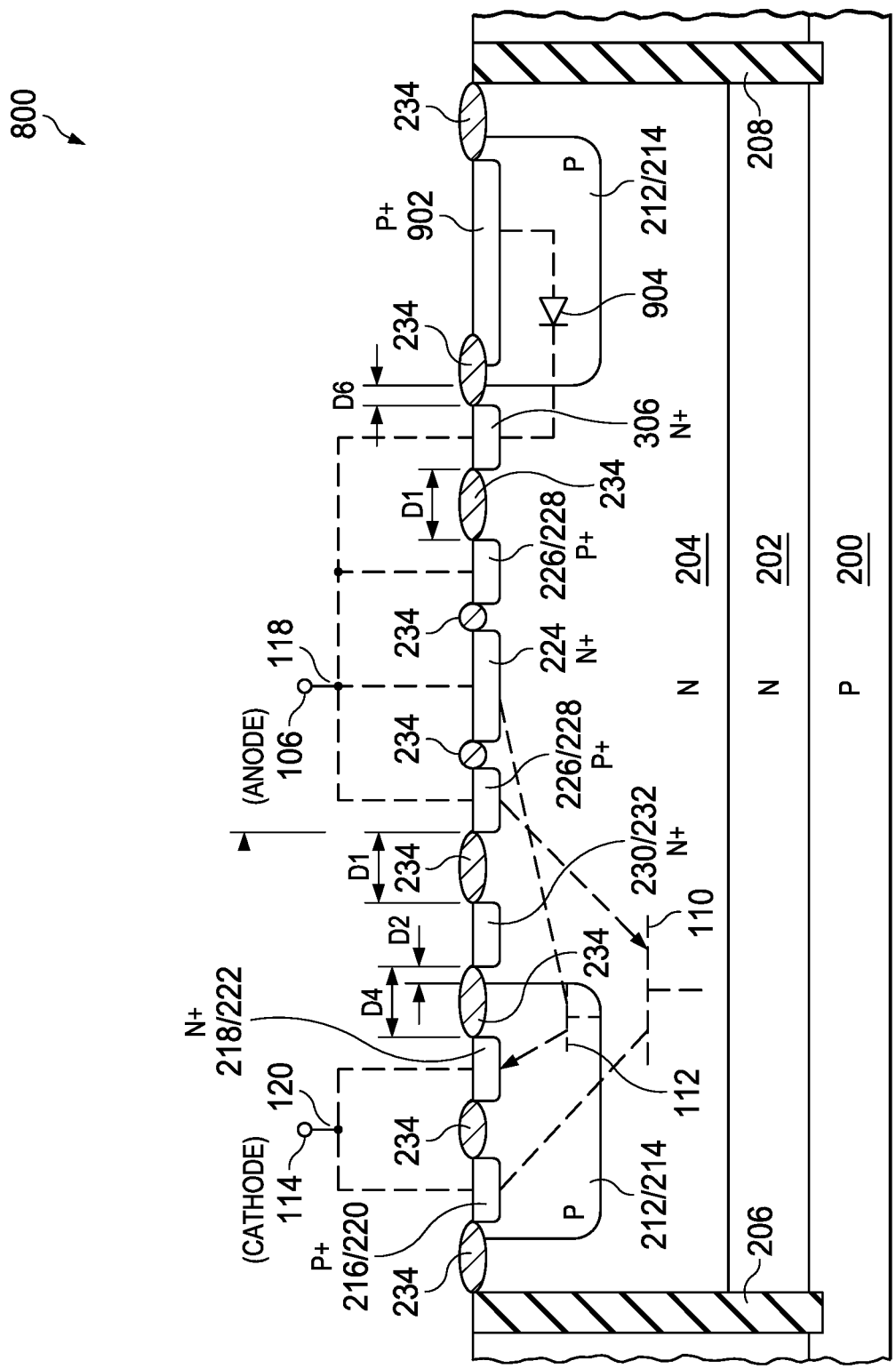
FIG. 9 illustrates a cross-sectional view across the vertical dashed line 9-9 in FIG. 8.

FIG. 8 illustrates a plan view, and FIG. 9 illustrates a cross-sectional view across the vertical dashed line 9-9 in FIG. 8, of a second alternative SCR 800. The SCR 800 includes many of the same aspects as the FIG. 3 SCR 108, and like numbers are used for like items in both figures. The SCR 800 includes, however, as shown along the horizontal top of in FIG. 8, an enlarged p+ region 902 in the continuous p well 212/214. As shown in the FIG. 9 cross-sectional view, the enlarged p+ region is the only heavy doped region within that area of the continuous p well 212/214, while in contrast the comparable FIG. 4 cross-sectional view includes two heavy doped regions, namely, the first p+ type continuous region 216/220 and the first n+ type continuous region 218/222 in the continuous p well 212/214. Accordingly, in FIGS. 8 and 9, the first n+ type continuous region 218/222 is non-concentric in the sense that it terminates at ends 804 and 806, rather than fully surround the third n+ region 224. Further, with this structure of excluding the first n+ type continuous region 218/222 along the top of FIG. 8, then FIG. 9 includes a schematic of a diode 904 superimposed to the right, with its anode provided by the combination of the illustrated portion of the enlarged p+ type region 902 and the adjacent first p type continuous well region 212/214, and with its cathode provided by a portion of the n type epi layer 204 and the electrically-contacted second interior n+ region 306. By comparing FIG. 9 to FIG. 4, note that the FIG. 4 diode 402 has an n+ type continuous region 218/222 proximate the diode 402 and within the same p well continuous region 212/214 as the diode 402, while the FIG. 9 diode 904 has no such proximate n+ region. In FIG. 4, the possible parasitic effects (e.g., creating a parasitic NPN conductive path) of the proximate n+ type continuous region 218/222 are reduced by enlarging the distance D5 between that region and the electrically-contacted second interior n+ region 306. In contrast, in FIG. 9, there is no such comparable parasitic effect because there is no proximate n+ region; further, with the absence of that n+ region, a minimum distance D6 between a portion of the diode 902 anode provided by the first p type continuous well region 212/214 is smaller than the FIG. 4 distance D3 between analogous regions, thereby reducing the overall size of the SCR 900, as compared to the SCR 108.

Figure 10:
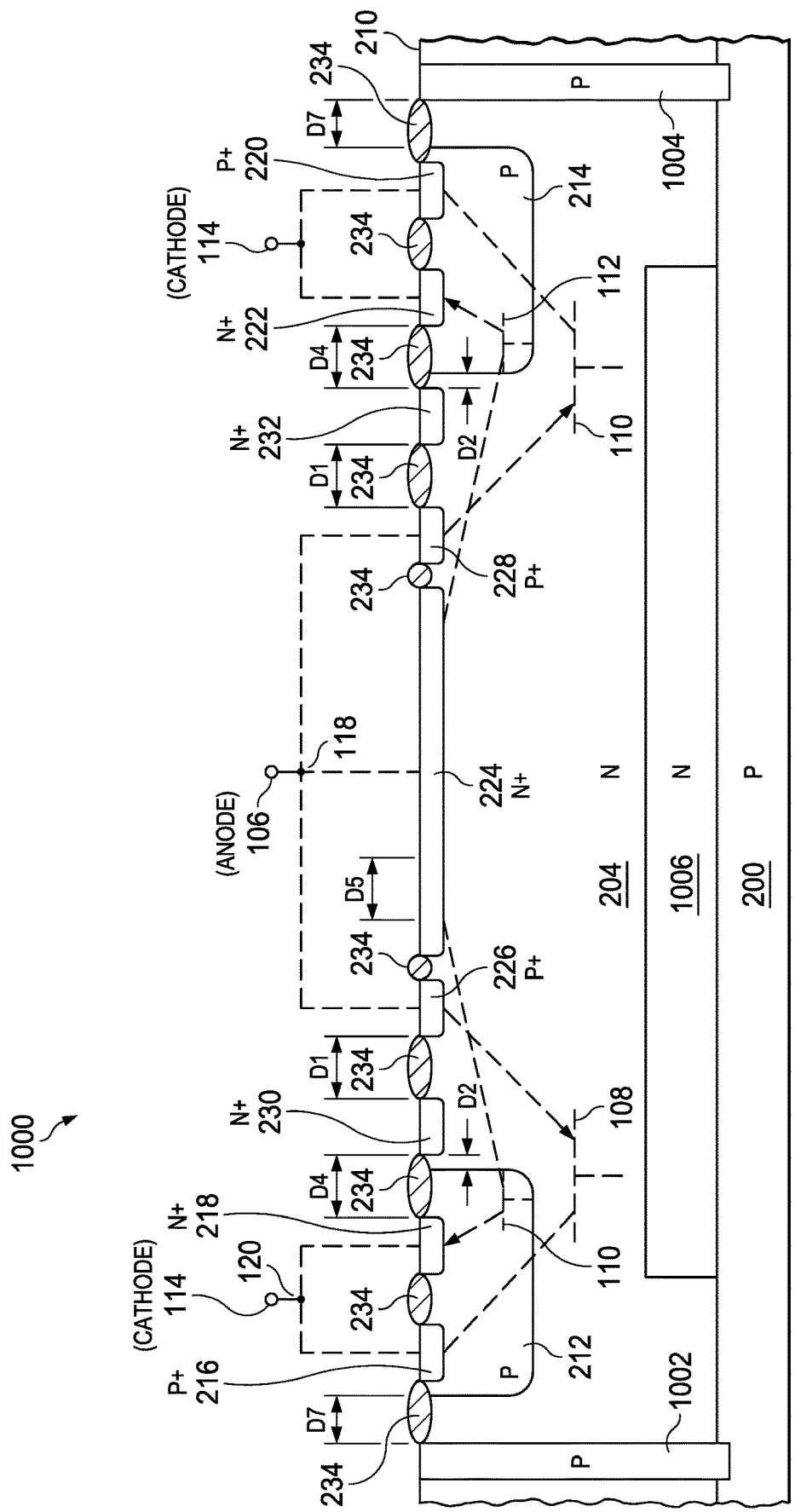
FIG. 10 illustrates a cross-sectional view of a third alternative SCR.

FIG. 10 illustrates a cross-sectional view of a third alternative SCR 1000. The SCR 1000 includes the same items as the FIG. 2 SCR 108, with the exception that instead of the earlier-described FIG. 2 trench regions 206 and 208, in the same relative vicinity the SCR 1000 includes p type junction isolation regions 1002 and 1004. Additionally, instead of the FIG. 2 n type buried layer 202, which spanned the entire distance between the trench regions 206 and 208, the SCRO 1000 includes an n type buried layer 1006 which may not span the entire distance between the p type junction isolation regions 1002 and 1004. Each of the p type junction isolation regions 1002 and 1004 is formed from the upper edge 210 of the n epi layer 204 down to contact the p type layer 200. Further, from a plan perspective (not separately shown), the p type junction isolation regions 1002 and 1004 form a continuous p type junction isolation region 1002/1004 that surrounds portions of the SCR 1000 within that continuous region. Accordingly, the surrounding portion isolates the SCR 1000, including its n type epi layer 204, for example relative to other components that also may be formed in connection with the same p type layer 200, with that layer serving as a common substrate for such components.

The FIG. 10 SCR 1000 may be modified to form other alternative embodiments. For example, FIG. 10 illustrates a distance D7 between the innermost edge of each of the p type junction isolation regions 1002 and 1004 and its proximate respective first p well 212 or second p well 214. In different embodiments, the distance D7 may be shortened or lengthened. For example, D7 may be shortened to an extent such that a diffusion tail from a p type junction isolation region 1002 or 1004 intersects the respective one of the proximate first p well 212 or second p well 214. In this manner, the dopant profile from the intersecting portion of the p type junction isolation region 1002 or 1004 may affect the gain of the NPN BJT 112. As another example, a separate step of forming the first p well 212 and second p well 214 can be eliminated, and instead the formation of the p type junction isolation regions 1002 and 1004 can be modified to cause the lateral diffusion of each to be sufficiently inward and under the first p+ type continuous region 216/220 and the first n+ type continuous region 218/222, thereby providing both the SCR isolation and a p type area so as to facilitate the NPN BJT 112, PNP 110, and diode 402 structures described above.

Figure 11:
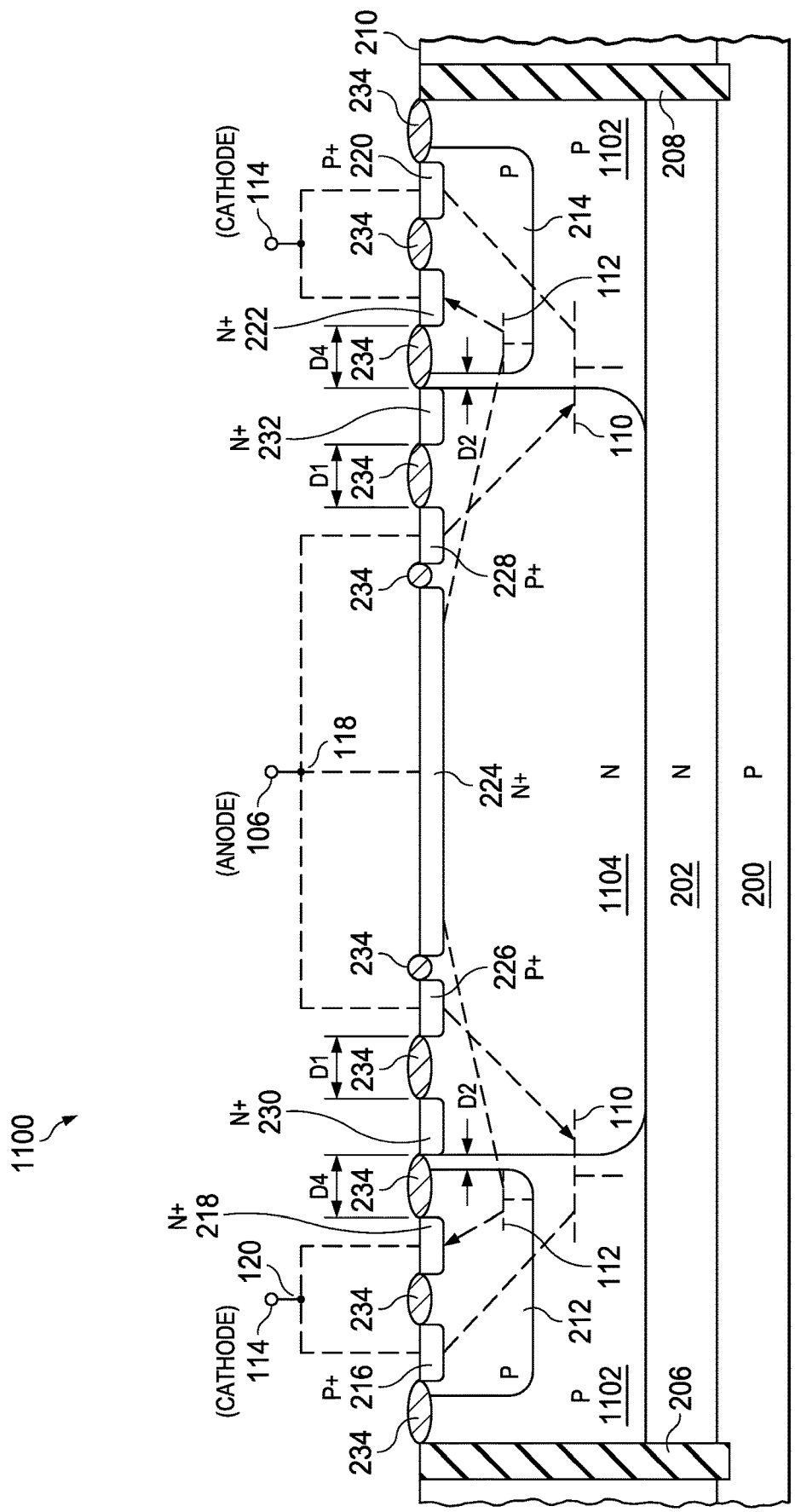
FIG. 11 illustrates a cross-sectional view of a fourth alternative SCR.

FIG. 11 illustrates a cross-sectional view of a fourth alternative SCR 1100. The SCR 1100 includes the same items as the FIG. 2 SCR 108, with an exception that instead of the earlier-described n type epi layer 204, the SCR 1100 includes a p type epi layer 1102. Additionally, an n well 1104 is formed within a central location of the p type epi layer 1102, and then the third n+ region 224 and the second p+ type continuous region 226/228 are formed within the n well 1104. In an example embodiment, the n well 1104 is formed to a depth to contact the n type buried layer 202. Accordingly, the FIG. 11 and FIG. 2 alternatives illustrate the flexibility of example embodiments contemplated in connection with either p type or n type epi layers, where the choice of either may in some instances be controlled by other components formed on the same IC as the SCR, but existing outside the surrounding layers of the SCR. In either case, an SCR with benefits as illustrated also may be implemented.

The illustrated example embodiments provide an SCR, for example for use in ESD protection. These embodiments may provide various benefits over prior ESD devices. For example, the various configurations provide benefit of a generally concentric layout that incorporates a negative strike diode. Such configurations can reduce overall area that otherwise might be required by some prior art devices, for example those that include large parallel ESD diodes. As another benefit, eliminating separate negative strike diodes also eliminates potential leakage and capacitance concerns. As still another benefit, various inventive aspects can be implemented in a variety of configurations. Several configurations have been presented, and the inventive scope may include still others as contemplated or may be determined by one skilled in the art from the teachings of this document. For instance, aspects of the described configurations may be selected and combined; for example, the FIG. 7 parallel electrically non-contacted third interior n+ region 702 and electrically-contacted second interior n+ region 306 may be implemented with the FIG. 9 enlarged p+ region 902 and/or eliminated first n+ type continuous region 218/222 in that well. Accordingly, additional modifications are possible in the described embodiments, and other embodiments are possible, within the scope of the following claims.

What is claimed is:

1. A silicon controlled rectifier (SCR), comprising:
a first semiconductor region;
a second semiconductor region circumscribing the first semiconductor region;
an electrically non-contacted region of a semiconductor type and partially surrounding the second semiconductor region, the electrically non-contacted region configured to provide a snapback operation of the silicon controlled rectifier; and
an electrically-contacted region of the semiconductor type and located adjacent to a side of the second semiconductor region and configured to provide a diodic operation of the silicon controlled rectifier, wherein a plurality of concentric semiconductor regions surrounds the electrically non-contacted region and the electrically-contacted region.

2. The SCR of claim 1, further comprising, an SCR anode coupled to the first semiconductor region and to the electrically-contacted region.

3. The SCR of claim 1, wherein:
the second semiconductor region provides an emitter for a PNP bipolar junction transistor (BJT);
a first concentric semiconductor region of the plurality of concentric semiconductor regions provides a collector for the PNP BJT; and
the electrically non-contacted region is positioned between the first concentric semiconductor region and the second semiconductor region.

4. The SCR of claim 1, wherein:
the first semiconductor region provides a collector for an NPN bipolar junction transistor (BJT);
a second concentric semiconductor region of the plurality of concentric semiconductor regions provides an emitter for the NPN BJT; and
the electrically non-contacted region is positioned between the first semiconductor region and the second concentric semiconductor region.

5. The SCR of claim 1, wherein:
the first semiconductor region provides a collector for an NPN bipolar junction transistor (BJT);
the second semiconductor region provides an emitter for a PNP BJT;
a first concentric semiconductor region of the plurality of concentric semiconductor regions provides a collector for the PNP BJT;
a second concentric semiconductor region of the plurality of concentric semiconductor regions provides an emitter for the NPN BJT, the second concentric semiconductor region located in the first concentric semiconductor region; and
the electrically non-contacted region is positioned between the second semiconductor region and the first concentric semiconductor region.

6. The SCR of claim 5, wherein the electrically non-contacted region is positioned between the second semiconductor region and the second concentric semiconductor region.

7. The SCR of claim 1, wherein:
the electrically non-contacted region of the semiconductor type is positioned at a first closest distance from a first concentric semiconductor region of the plurality of concentric semiconductor regions; and the electrically-contacted region of the semiconductor type is positioned at a second distance greater than the first distance from the first concentric semiconductor region of the plurality of concentric semiconductor regions.

8. The SCR of claim 7, wherein the second distance is greater than the first distance by a factor of two to three.

9. The SCR of claim 7, wherein:
the electrically non-contacted region of the semiconductor type is positioned at a third distance from a second concentric semiconductor region of the plurality of concentric semiconductor regions, the third distance greater than the first distance; and
the electrically-contacted region of the semiconductor type is positioned at a fourth distance greater than the second distance from the second concentric semiconductor region of the plurality of concentric semiconductor regions, the fourth distance greater than the third distance.

10. The SCR of claim 1, wherein:
a second concentric semiconductor region of the plurality of concentric semiconductor regions provides an emitter for an NPN bipolar junction transistor (BJT); and
a first concentric semiconductor region of the plurality of concentric semiconductor regions provides a collector for a PNP BJT.

11. The SCR of claim 1, wherein the electrically non-contacted region presents a U-shaped configuration from a plan perspective.

12. The SCR of claim 1, wherein the electrically-contacted region presents a linear configuration from a plan perspective.

13. The SCR of claim 1, wherein:
the electrically non-contacted region presents a U-shaped configuration from a plan perspective; and
the electrically-contacted region presents a linear configuration from the plan perspective.

14. The SCR of claim 1, further comprising:
a trench isolation region surrounding the plurality of concentric semiconductor regions.

15. The SCR of claim 1, wherein:
a second concentric semiconductor region of the plurality of concentric semiconductor regions provides an emitter for an NPN bipolar junction transistor (BJT);
a first concentric semiconductor region of the plurality of concentric semiconductor regions provides a collector for a PNP BJT; and
the SCR includes a p type well in which the first concentric semiconductor region and the second concentric semiconductor region are formed.

16. The SCR of claim 15, further comprising:
an n type epi layer in which the p type well is formed.

17. The SCR of claim 1, wherein the plurality of concentric semiconductor regions includes a concentric isolation region.

18. The SCR of claim 1, wherein the snapback operation includes a breakdown of a junction between a first concentric semiconductor region of the plurality of concentric semiconductor regions and an epi layer in which the first concentric semiconductor region is located.

19. The SCR of claim 1, wherein the snapback operation includes a current path through the electrically non-contacted region.

20. the SCR of claim 1, wherein the diodic operation includes forward-biasing a diode formed between a first concentric semiconductor region of the plurality of concentric semiconductor regions and the electrically-contacted region.

21. The SCR of claim 1, wherein the diodic operation includes a current path through the electrically-contacted region.

22. The SCR of claim 1, wherein:
  the snapback operation is in response to a first electrostatic discharge pulse at the first semiconductor region, the first electrostatic discharge pulse having a first polarity; and
  the diodic operation is in response to a second electrostatic discharge pulse at the first semiconductor region, the second electrostatic discharge pulse having a second polarity opposite the first polarity.

* * * * *